(12) United States Patent
Hu

(10) Patent No.: US 12,507,443 B2
(45) Date of Patent: Dec. 23, 2025

(54) SEMICONDUCTOR DEVICES AND ELECTRONIC DEVICES

(71) Applicant: WUHAN CHINA STAR OPTOELECTRONICS TECHNOLOGY CO., LTD., Hubei (CN)

(72) Inventor: Zemin Hu, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 376 days.

(21) Appl. No.: 18/255,263

(22) PCT Filed: Feb. 28, 2023

(86) PCT No.: PCT/CN2023/078622
§ 371 (c)(1),
(2) Date: May 31, 2023

(87) PCT Pub. No.: WO2024/159567
PCT Pub. Date: Aug. 8, 2024

(65) Prior Publication Data
US 2024/0363761 A1   Oct. 31, 2024

(30) Foreign Application Priority Data

Jan. 31, 2023 (CN) .......................... 202310098874.4

(51) Int. Cl.
*H01L 27/12* (2006.01)
*H01L 29/86* (2006.01)
(Continued)

(52) U.S. Cl.
CPC ....... *H10D 30/6757* (2025.01); *H10D 86/431* (2025.01); *H10D 86/60* (2025.01)

(58) Field of Classification Search
CPC .......... H10D 30/6757; H10D 30/6708; H10D 30/6715; H10D 30/67; H10D 30/501;
(Continued)

(56) References Cited

U.S. PATENT DOCUMENTS

| 8,124,974 B2 * | 2/2012 | Noda .................. G02F 1/13624 257/E33.053 |
| 2002/0125535 A1 | 9/2002 | Ueda |
| 2010/0032674 A1 * | 2/2010 | Noda .................. G02F 1/13624 257/E33.053 |

FOREIGN PATENT DOCUMENTS

| CN | 104282696 A | 1/2015 |
| CN | 104795441 A | 7/2015 |

(Continued)

OTHER PUBLICATIONS

International Search Report in International application No. PCT/CN2023/078622, mailed on May 15, 2023.
(Continued)

*Primary Examiner* — Nikolay K Yushin
(74) *Attorney, Agent, or Firm* — PV IP PC; Peter S. Stecher; Wei Te Chung

(57) ABSTRACT

A semiconductor device and an electronic device are provided by the present disclosure. The active layer is provided by the semiconductor device to include a conductor portion, so that a projection of the conductor portion on the substrate is located within a projection of the gate on the substrate. The conductor portion is not controlled by the gate, so the width of the channel portion may be controlled by controlling the width of the gate and the width of the conductor portion, so that the channel length may break through the accuracy limit of the exposure machine, thereby improving the mobility of the thin film transistor.

18 Claims, 6 Drawing Sheets

(51) Int. Cl.
*H10D 30/67* (2025.01)
*H10D 86/40* (2025.01)
*H10D 86/60* (2025.01)

(58) Field of Classification Search
CPC ............. H10D 30/673; H10D 30/6755; H10D 86/431; H10D 86/40; H10D 86/60; H10D 86/00; H10D 86/421; H10D 62/17; H10D 62/151; H10D 62/145; H10D 62/13
See application file for complete search history.

(56) References Cited

FOREIGN PATENT DOCUMENTS

| | | |
|---|---|---|
| CN | 109904222 A | 6/2019 |
| KR | 20050108305 A | 11/2005 |

OTHER PUBLICATIONS

Written Opinion of the International Search Authority in International application No. PCT/CN2023/078622, mailed on May 15, 2023.

* cited by examiner (a)

(b)

(c)

(d)

SEMICONDUCTOR DEVICES AND ELECTRONIC DEVICES

CROSS REFERENCE TO RELATED APPLICATIONS

This application is a continuation of International Application No. PCT/CN2023/078622, filed on Feb. 28, 2023, which claims priority to and the benefit of Chinese Patent Application No. 202310098874.4, filed on Jan. 31, 2023. The disclosures of the aforementioned applications are incorporated herein by reference in their entireties.

TECHNICAL FIELD

The present disclosure relates to a display technical field, and in particular to semiconductor devices and electronic devices.

BACKGROUND

With the development of display technologies, display devices of the prior art have increasingly high requirements for narrow borders, high opening rate, high brightness, and high resolution. Therefore, it is necessary to reduce sizes of thin film transistors while improving their mobility to ensure the performance of the thin film transistors. Specifically, the display devices of the prior art may reduce a length of a channel to be less than a length of a crystalline grain, thereby eliminating the influence of grain boundaries and improving the mobility of the thin film transistors. However, due to the accuracy limitations of exposure machines, it is not possible to effectively reduce the length of the channel, resulting in a lower migration rate of the thin film transistors.

Therefore, there are technical problems for the thin film transistors of the prior art that larger channel lengths and lower mobility of the thin film transistors are resulted by the accuracy limit of the exposure machines.

SUMMARY

Technical Problems

The embodiments of the present disclosure provide a semiconductor device, a manufacturing method thereof and electronic device, to alleviate the technical problems for thin film transistors of the prior art that larger channel lengths and lower mobility of the thin film transistors are resulted by the accuracy limit of the exposure machines.

Technical Solutions

To solve the above problems, the technical solutions provided by the present disclosure are as follows.

An embodiment of the present disclosure provides a semiconductor device, the semiconductor device includes a thin film transistor, and the thin film transistor includes:
  a substrate;
  an active layer disposed on a side of the substrate, the active layer comprising a doped portion and a channel portion; and
  a gate layer disposed on a side of the active layer away from the substrate, the gate layer including a gate;
  wherein the active layer includes a conductor portion, a projection of the conductor portion on the substrate is located within a projection of the gate on the substrate, and the channel portion is disposed between the conductor portion and the doped portion.

In some embodiments, the channel portion includes a first channel portion and a second channel portion, and the first channel portion and the second channel portion are disposed at two sides of the conductor portion.

In some embodiments, a width of the first channel portion is greater than or equal to a width of the second channel portion.

In some embodiments, the doped portion includes a plurality of parts, the thin film transistor further includes a source drain layer, the source drain layer includes a source and a drain, the source and the drain are respectively connected with the plurality of parts of the doped portion, and a dopant ion concentration in the conductor portion is greater than or equal to a doping ion concentration in the doped portion.

In some embodiments, the active layer further includes an electrical property adjustment portion, the electrical property adjustment portion is located between the doped portion and the channel portion, and a doping ion concentration in the electrical property adjustment portion is greater than or equal to a doping ion concentration in the channel portion and is less than the doping ion concentration in the doped portion.

In some embodiments, the thin film transistor further includes a shielding metal, the shielding metal is disposed between the active layer and the gate layer, a projection of the shielding metal on the substrate is located within the projection of the gate on the substrate, and a width of the shielding metal is smaller than a width of the gate.

In some embodiments, the thin film transistor further includes a gate insulating layer disposed between the active layer and the gate layer, the shielding metal is covered by the gate insulating layer, and the shielding metal is in contact with the conductor portion.

In some embodiments, the thin film transistor further includes a first insulating layer and a second insulating layer, the first insulating layer is disposed between the active layer and the shielding metal, and the second insulating layer is disposed between the shielding metal and the gate layer.

In some embodiments, wherein a width of the channel portion is smaller than a width of the conductor portion.

In some embodiments, a width of the channel portion is less than 1.5 microns.

In addition, an embodiment of the present disclosure provides an electronic device including:
  a semiconductor device, the semiconductor device including a thin film transistor, and the thin film transistor including:
  a substrate;
  an active layer disposed on one side of the substrate, the active layer comprising a doped portion and a channel portion;
  a gate layer disposed on a side of the active layer away from the substrate, the gate layer including a gate; and
  wherein the active layer includes a conductor portion, a projection of the conductor portion on the substrate is located within a projection of the gate on the substrate, and the channel portion is disposed between the conductor portion and the doped portion.

In some embodiments, the channel portion includes a first channel portion and a second channel portion, and the first channel portion and the second channel portion are disposed at two sides of the conductor portion.

In some embodiments, a width of the first channel portion is greater than or equal to a width of the second channel portion.

In some embodiments, the doped portion includes a plurality of parts, the thin film transistor further includes a source drain layer, the source drain layer includes a source and a drain, the source and the drain are respectively connected with the plurality of parts of the doped portion, and a doping ion concentration in the conductor portion is greater than or equal to a doping ion concentration in the doped portion.

In some embodiments, the active layer further includes an electrical property adjustment portion, the electrical property adjustment portion is located between the doped portion and the channel portion, and a doping ion concentration in the electrical property adjustment portion is greater than or equal to a doping ion concentration in the channel portion and is less than the doping ion concentration in the doped portion.

In some embodiments, the thin film transistor further includes a shielding metal, the shielding metal is disposed between the active layer and the gate layer, a projection of the shielding metal on the substrate is located within the projection of the gate on the substrate, and a width of the shielding metal is smaller than a width of the gate.

In some embodiments, the thin film transistor further includes a gate insulating layer disposed between the active layer and the gate layer, the shielding metal is covered by the gate insulating layer, and the shielding metal is contacted with the conductor portion.

In some embodiments, the thin film transistor further includes a first insulating layer and a second insulating layer, the first insulating layer is disposed between the active layer and the shielding metal, and the second insulating layer is disposed between the shielding metal and the gate layer.

In some embodiments, a width of the channel portion is smaller than a width of the conductor portion.

In some embodiments, a width of the channel portion is less than 1.5 microns.

Beneficial Effects

The embodiments of the present disclosure provide the semiconductor device and the electronic device. The semiconductor device includes the thin film transistor, the thin film transistor includes the substrate, and the active layer and the gate layer. The active layer is disposed on a side of the substrate, and the active layer includes the doped portion and the channel portion. The gate layer is disposed on a side of the active layer away from the substrate, and the gate layer includes the gate. The active layer includes the conductor portion, the projection of the conductor portion on the substrate is located within the projection of the gate on the substrate, and the channel portion is disposed between the conductor portion and the doped portion. By the active layer including the conductor portion, and the projection of the conductor portion on the substrate being located within the projection of the gate on the substrate, the conductor portion is not controlled by the gate, and the channel portion between the conductor portion and the doping portion is controlled by the gate to ensure that the thin film transistor may work normally. At the same time, the width of the channel portion may be controlled by controlling the width of the gate and the width of the conductor portion, and both the gate and conductor portions may be prepared with the maximum accuracy of the exposure machine, which may ensure that the channel length may break through the accuracy limit of the exposure machine, thereby improving the mobility of the thin film transistor.

DETAILED DESCRIPTION OF THE EMBODIMENTS

The technical solutions in the embodiments of the present disclosure may be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

The embodiments of the present disclosure provide a semiconductor device and electronic device to alleviate the technical problem for thin film transistors of the prior art that larger channel lengths and lower mobility of the thin film transistors are resulted by the accuracy limit of the exposure machines.

Figure 1:
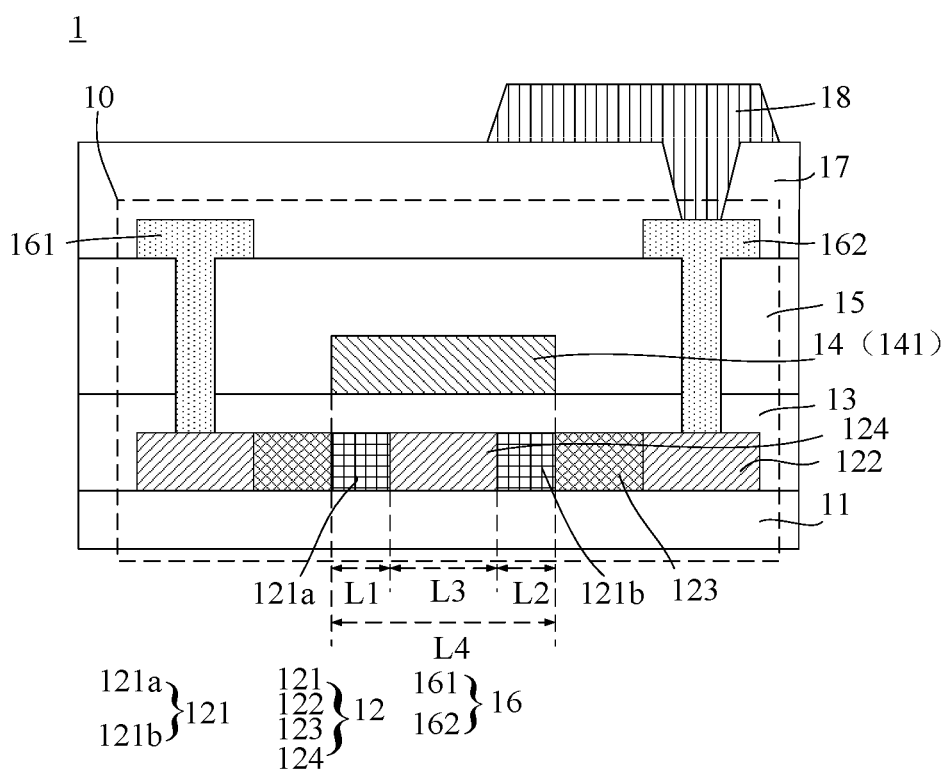
FIG. 1 is a first schematic view of a semiconductor device provided by an embodiment of the present disclosure.
Figure 2:
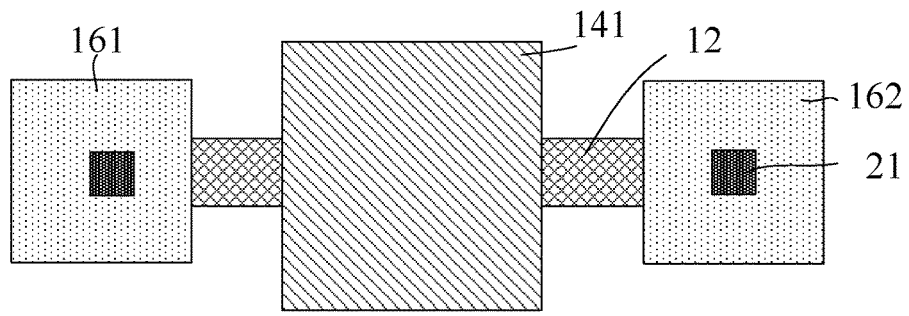
FIG. 2 is a second schematic view of the semiconductor device provided by an embodiment of the present disclosure.
Figure 2:
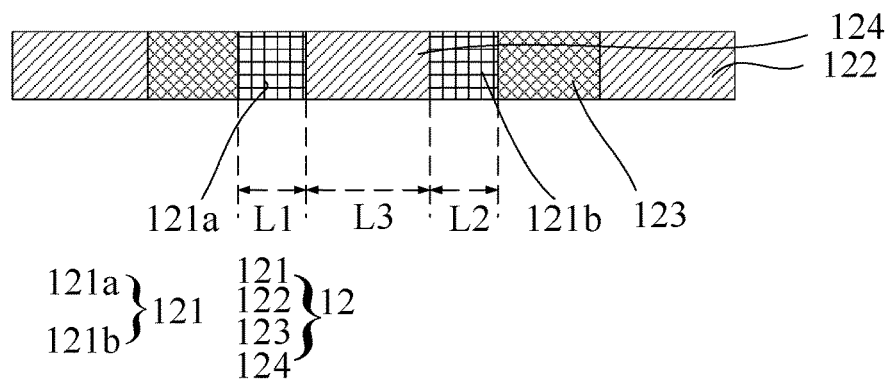
Figure 2:
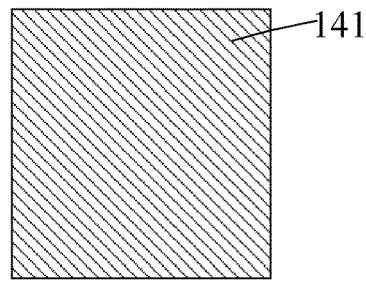
Figure 2:
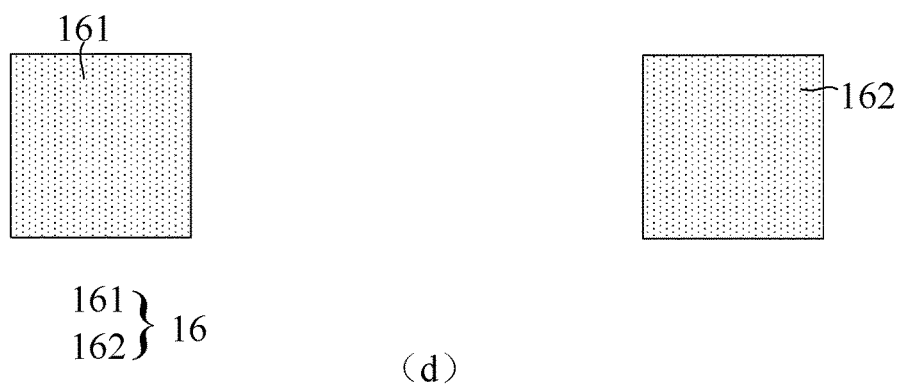

As shown in FIGS. 1 and 2, the embodiment of the present disclosure provides a semiconductor device, the semiconductor device 1 includes a thin film transistor 10, and the thin film transistor 10 includes:
  a substrate 11;
  an active layer 12 disposed on a side of the substrate 11, the active layer 12 including a doped portion 122 and a channel portion 121; and
  a gate layer 14 disposed on a side of the active layer 12 away from the substrate 11, the gate layer 14 including a gate 141.

The active layer 12 includes a conductor portion 124, a projection of the conductor portion 124 on the substrate is located within a projection of the gate 141 on the substrate, and the channel portion 121 is disposed between the conductor portion 124 and the doped portion 122

The semiconductor device is provided by the embodiment of the present disclosure. The active layer includes the conductor portion, and the projection of the conductor portion on the substrate is located within the projection of the gate on the substrate, so that the conductor portion may be not controlled by the gate, and the channel portion between the conductor portion and the doping portion is controlled by the gate to ensure that the thin film transistor may work normally. At the same time, the width of the channel portion may be controlled by controlling the width of the gate and the width of the conductor portion, and both the gate and conductor portions may be prepared with the maximum accuracy of the exposure machine, which may ensure that the channel length may break through the accuracy limit of the exposure machine, thereby improving the mobility of the thin film transistor.

It should be noted that in FIGS. 1 to 4, as the gate layer 14 only shows the gate 141, the gate layer 14 and gate 141 are marked in a way shown in FIG. 1. But the embodiment of the present disclosure does not limit the gate layer 14 to only include the gate 141, and the gate layer may further include scanning lines and other wires.

It should be noted that the conductor portion refers to a part that may directly conduct electricity. Specifically, the conductor portion may be a conductor, a semiconductor material forming a conductor by doping ions, or a semiconductor material in contact with a metal to improve its conductivity through the short-circuit effect of the metal. When the conductor portion is connected with the doping portion, the conductor portion may conduct the doping portion without changing the potential of the gate, while the channel portion refers to a part controlled by the potential of the gate. The channel portion changes into a conduction state or a non-conduction state as the potential of the gate changes. When in the conduction state, the channel portion may conduct the doping portions on both sides. More specifically, the conductivity of the conductor portion may be the same as that of the doping portion, while the conductivity of the channel portion is weaker than that of the doping portion. Moreover, when the potential of the gate is lower than an opening voltage of the thin film transistor, the channel portion is uncapable of conducting the doping portions on both sides. Alternatively, the conductivity of the conductor portion is the same as that of the channel portion, and the conductor portion is in direct contact with the metal, allowing the conductor portion to directly conduct the connected doping portion.

It should be noted that in the embodiments of the present disclosure, the accompanying drawings take a width of the gate and a sum of widths of the channel portion and the conductor portion as examples. For example, in FIG. 1, the width of the gate is L4, and the sum of the widths of the channel portion and the conductor portion is also L4, but the embodiments of the present disclosure are not limited to this. For example, when the gate extends to an area corresponding to the electrical adjustment portion and the conductivity of the electrical adjustment portion is not controlled by the gate, a boundary of the channel portion is defined as a boundary of the conductor portion and/or a undoped ion portion. Correspondingly, the sum of the widths of the channel portion and the conductor portion is less than the width of the gate. For ease of explanation, the following embodiments takes the gate width as L4, and the sum of the widths of the channel portion and the conductor portion as L4 as an example for explanation.

Specifically, (a) in FIG. 2 is a perspective view of the thin film transistor provided by the embodiment of the present disclosure. (b) in FIG. 2 is a top view of the active layer of the thin film transistor of the (a) in FIG. 2, (c) is a top view of the gate of the thin film transistor of the (a) in FIG. 2, and (d) is a top view of the source drain layer in the thin film transistor of the (a) in FIG. 2.

Specifically, mark 21 in the (a) in FIG. 2 represents a via hole, which may be a via hole defined in the interlayer insulation layer.

Specifically, with the current accuracy of the exposure machine, minimum line widths of the electrodes and wires that may be prepared are 1.5 microns, correspondingly, a minimum length of a channel is only capable of reaching 1.5 microns. In the embodiment of the present disclosure, by invalidating a part of the active layer (disposing a conductor portion under the gate), it may be understood that both the conductor portion and the gate may be prepared according to the current accuracy of the exposure machine, for example, if the width of the conductor portion is 1.5 microns, and the width of the gate is 2 microns, the length of the channel portion may be 0.5 microns, and the corresponding channel length is 0.5 microns. This means that the channel length formed in the embodiment of the present disclosure is capable of breaking through the accuracy limit of the exposure machine, and the channel length is capable of being reduced, improving the mobility of the thin film transistor.

From the above analysis, it may be obtained that when reducing the channel length, the line width of the gate does not need to be designed based on the accuracy of the exposure machine, so that when forming the gate, the line width of the gate may be increased, avoiding the problem of gate breakage caused by the inaccurate alignment of the photo mask in a plurality of processes during gate formation.

Regarding the problem of the channel length changes caused by offset during gate preparation, and the channel length does not meet the requirements, in an embodiment, as shown in FIGS. 1 and 2, the channel portion 121 includes a first channel portion 121a and a second channel portion 121b, and the first channel portion 121a and the second channel portion 121b are disposed on both sides of the conductor portion 124. By disposing the channel portion as the first channel portion and the second channel portion, and ensuring that the first channel portion and the second channel portion are located on both sides of the conductor portion, the sum of the widths of the first channel portion and the second channel portion may not change when the gate is offset during the preparation process of the gate, thereby avoiding changes in the channel length and ensuring that the channel length meets the requirements.

Specifically, as shown in FIGS. 1 and 2, the width of the first channel portion 121a is L1, and the width of the second channel portion 121b is L2. Regardless of whether the gate 141 is left or right biased, the sum (L1+L2) of the widths of the first channel portion 121a and the second channel portion 121b may not change, avoiding changes in the performance of the thin film transistor.

Specifically, taking the channel portion 121 and the electrical adjustment portion 123 where no ions are doped as examples, the width of the channel portion 121 is the difference between the width of the gate 141 and the conductor portion 124. When preparing the gate 141, even if the position of the gate is offset due to incorrect alignment of the photo mask, the width of the gate may not change, and the width of the conductor portion does not change, so that the width of the channel portion may not change. That is, the length of the channel does not change, making the channel length be the preset channel length to avoid changes in the performance of thin film transistors.

Specifically, the width of the channel portion is smaller than the width of the conductor portion. Taking FIG. 1 as an example, the sum of the width of the first channel portion 121a and the width of the second channel portion 121b (L1+L2) is less than the width L3 of the conductor portion 124. In the embodiment of the present disclosure, the width of the conductor portion may be the minimum line width under the accuracy of the exposure machine, so that the width of the channel portion is less than the width of the conductor portion, and the channel length exceeds the accuracy of the exposure machine.

Specifically, the width of the first channel portion is smaller than or equal to the width of the second channel portion. Taking FIG. 1 as an example, the width L1 of the first channel portion 121a is smaller than or equal to the width L2 of the second channel portion 121b.

Specifically, the above embodiments take the channel portion including the first channel portion and the second channel portion as an example for explain, but the embodiments of the present disclosure are not limited to this. For example, the channel portion is only disposed on one side of the conductor portion.

In an embodiment, as shown in FIGS. 1 and 2, the doping portion 122 includes a plurality of parts, the thin film transistor 10 further includes a source drain layer 16, and the source drain layer 16 includes a source 161 and a drain 162. The source 161 and the drain 162 are respectively connected to the plurality of parts of the doping portion 122. The doping ion concentration in the conductor portion 124 is greater than or equal to the doping ion concentration in the doping portion 122, which ensures that the conductivity of the conductor portion is equal to or better than that of the doping portion. The doping portion is connected to the source and the drain, and the doping portion may directly conduct electricity. Correspondingly, the conductor portion may directly conduct electricity, and the conductor portion may not change the conduction state according to the potential change of the gate, making a part of areas under the gate ineffective and reducing the channel length, and improving the mobility of thin film transistor.

Specifically, as shown in FIGS. 1 and 2, the mark 21 represents the via hole which is used to connect the doping portion with the source and the drain. It can be understood that the doping portion connected to the source and the drain has good conductivity and may directly conduct electricity with the source and the drain.

Specifically, the doping ion concentration in the conductor portion are equal to that of the doping portion. By making the doping ions in the conductor portion equal to the concentration of the doping ions in the doping portion, both the conductor portion and the doping portion can be doped simultaneously when forming the conductor portion, reducing process steps and improving the preparation efficiency of semiconductor devices.

In an embodiment, as shown in FIGS. 1 and 2, the active layer 12 further includes an electrical adjustment portion 123, which is located between the doping portion 122 and the channel portion 121. The doping ion concentration in the electrical adjustment portion 123 is greater than or equal to the doping ion concentration in the channel portion 121, and the doping ion concentration in the electrical adjustment portion 123 is less than the doping ion concentration in the doping portion 122. By disposing the electrical adjustment portion, the doping ion concentration of the electrical adjustment portion greater than or equal to the doping ion concentration of the channel portion, and the doping ion concentration of the electrical adjustment portion is less than the doping ion concentration in the doping portion, the electrical properties of the thin film transistor is capable of being adjusted to avoid leakage of the thin film transistor.

Specifically, the doping ion concentration of the electrical adjustment portion is equal to the doping ion concentration of the channel portion, so that the doping ion concentration of the electrical adjustment portion is equal to the doping ion concentration of the channel portion. When the channel portion is not doped with ions, the doping ion concentration of the channel portion and the doping ion concentration of the electrical adjustment portion are both 0, so that the channel portion may not be in direct contact with the doping portion, avoiding direct conduction of the channel and causing leakage of the thin film transistor.

Specifically, the doping ion concentration in the electrical adjustment portion is greater than that in the channel portion, which may avoid that the potential barrier between the channel portion and the doping portion is too large, leading to excessive power consumption in the thin film transistor. Moreover, the channel portion is not in direct contact with the doping portion, avoiding direct conduction of the channel and causing leakage in the thin film transistor.

In an embodiment, the width of the channel portion is less than 1.5 microns, which makes the channel length of the thin film transistor break through the accuracy limit of the exposure machine, reducing the channel length, and improving the mobility of the thin film transistor.

Figure 3:
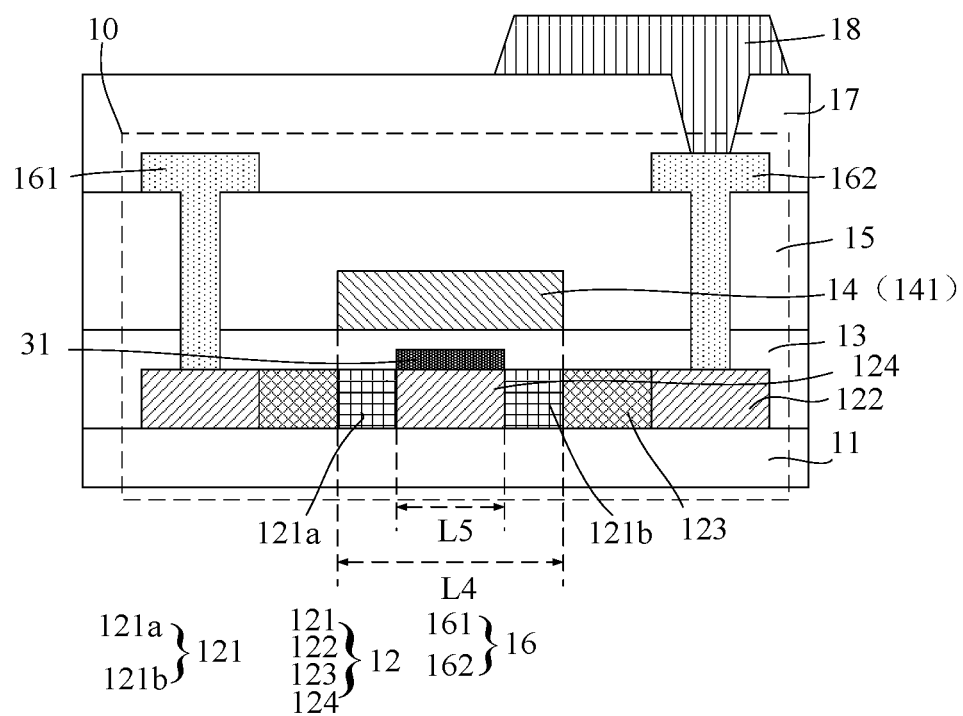
FIG. 3 is a third schematic view of the semiconductor device provided by an embodiment of the present disclosure.

In an embodiment, as shown in FIG. 3, the thin film transistor 10 further includes a shielding metal 31, which is disposed between the active layer 12 and the gate layer 14. A projection of the shielding metal 31 on the substrate 11 is located within a projection of the gate 141 on the substrate 11, and a width L5 of the shielding metal 31 is less than the width of the gate 141. By disposing the shielding metal between the gate and the conductor portion, the shielding metal further shields the influence of the gate on the conductor portion. The width of the channel portion may be controlled by controlling the width of the gate and the width of the shielding metal. The difference in width between the gate and the shielding metal is defined as the channel length. Both the gate and the shielding metal may be prepared with the maximum accuracy of the exposure machine, allowing the channel length to break through the accuracy limit of the exposure machine, thus improving the mobility of the thin film transistor.

Specifically, the width of the shielding metal is smaller than the width of the gate, so that the conductor portion located of the active layer under the shielding metal is capable of being not controlled by the gate, and the channel portion serves as the effective channel portion to ensure the normal working of the thin film transistor. The width of the channel portion may be controlled by controlling the width of the gate and the width of the shielding metal. The difference in width between the gate and the shielding metal is defined as the effective channel length. Both the gate and the shielding metal may be prepared with the maximum accuracy of the exposure machine, allowing the channel length to break through the accuracy limit of the exposure machine, thus improving the mobility of the thin film transistor.

In an embodiment, as shown in FIG. 3, the thin film transistor 10 further includes a gate insulation layer 13, which is disposed between the active layer 12 and the gate layer 14. The gate insulation layer 13 covers the shielding metal 31, and the shielding metal 31 is in contact with the conductor portion 124. By disposing the shielding metal between the gate insulation layer and the conductor portion, the shielding metal may shield the control of the gate on the conductor portion, making the active layer under the shielding metal ineffective. The effective part of the channel is a part of the area of the channel portion without the shielding metal, which may reduce the channel length and improve the mobility of the thin film transistor. The shielding metal is in contact with the conductor portion, allowing the shielding metal to further and directly improve the conductivity of the conductor portion. Shielding the control of the gate on the conductor portion, allowing carriers to move directly from the shielding metal when moving, allowing the thin film transistor to operate working.

Specifically, when the shielding metal is in direct contact with the conductor portion, the doping ion concentration in the conductor portion may be equal to that in the channel portion, and the doping ion concentration in the conductor portion may be greater than that in the channel portion. For example, the doping ion concentration in the conductor portion is greater than or equal to that in the doping portion. By directly contacting the shielding metal with the conductor portion, even if the doping ion concentration of the conductor portion is equal to that of the channel portion, due to the short-circuit effect of the shielding metal, the conductor portion may still conduct the channel portions on both sides. Moreover, due to the shielding metal shielding the conductor portion, the conductor portion is not affected by the gate, so the width of the channel portion may be controlled by controlling the width of the gate and the width of the shielding metal, and the channel length may break through the accuracy limit of the exposure machine, thereby improving the mobility of thin film transistors.

Specifically, direct contact between the shielding metal and the conductor may improve the conductivity of the conductor portion. When the carrier moves, due to the good conductivity of the shielding metal, the carrier may move directly from the shielding metal without moving from the conductor portion, avoiding the excessive blocking effect of the conductor portion on the carrier which leads to a failure of conduction of the transistor.

Figure 4:
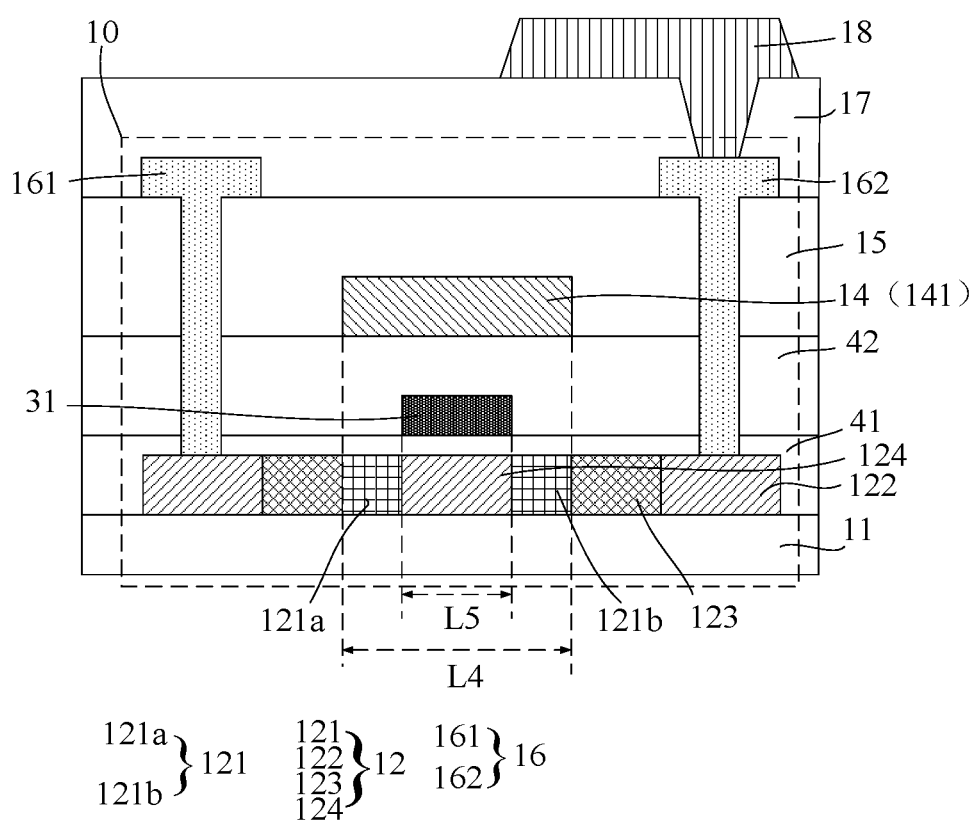
FIG. 4 is a forth schematic view of the semiconductor device provided by an embodiment of the present disclosure.

In an embodiment, as shown in FIG. 4, the thin film transistor 10 further includes a first insulation layer 41 and a second insulation layer 42, the first insulation layer 41 is disposed between the active layer 12 and the shielding metal 31, and the second insulation layer 42 is disposed between the shielding metal 31 and the gate layer 14. When disposing the shielding metal, the shielding metal may be disposed between the insulation layers, to allow the shielding metal shield the control effect of the gate, making the channel located under the shielding metal ineffective, reducing the channel length, and improving the mobility of the thin film transistor.

Specifically, it can be understood that one of the first and second insulation layers may be a gate insulation layer to reduce the film layer of the semiconductor device and to achieve miniaturization of the semiconductor device.

Specifically, when the shielding metal is not in contact with the channel portion, the shielding metal may be connected to other signal terminals. Specifically, in order to shield the gate, the shielding metal may be connected to the grounding terminal to avoid the gate controlling a part of the channel portion corresponding to the shielding metal, making the part of the channel portion under the shielding metal ineffective, reducing the channel length, and improving the mobility of the thin film transistor.

Specifically, it can be understood that the embodiment of the present disclosure takes the active layer including the electrical adjustment portion as an example for explanation, but the embodiments of present disclosure are not limited to this, for example, the doping portion may be in direct contact with the channel portion.

In an embodiment, as shown in FIG. 1, the semiconductor device 1 further includes an interlayer insulation layer 15, a planarization layer 17, and a pixel electrode layer 18. The interlayer insulation layer 15 is disposed between the gate layer 14 and the source drain layer 16, and the planarization layer 17 is disposed between the source drain layer 16 and the pixel electrode layer 18.

Specifically, as shown in FIG. 4, since the width L5 of the shielding metal 31 in FIG. 4 is equal to the width L3 of the conductor portion 124, the same width is marked by L3 and L5.

Specifically, the embodiment of the present disclosure takes a thin film transistor in the semiconductor device as an example, but it can be understood that other thin film transistors may adopt the same or different designs as the thin film transistor, and different thin film transistors may adopt different designs in the embodiments of the present disclosure. For example, some thin film transistors may include the conductor portion and the channel portion, and some thin film transistors further includes the shielding metal on the channel portion.

Specifically, light doping regions are disposed between channel regions, the light doping region may still be controlled by the gate, unable to reduce the channel length and break through the accuracy of the exposure machine. Compared to disposing the light doping regions between channel regions, the embodiment of the present disclosure is to make a part of the channel portion ineffective, reduce the length of the effective channel, and break through the accuracy limit of the exposure machine to reduce the channel length, thereby improving the mobility of the thin film transistor.

Figure 5:
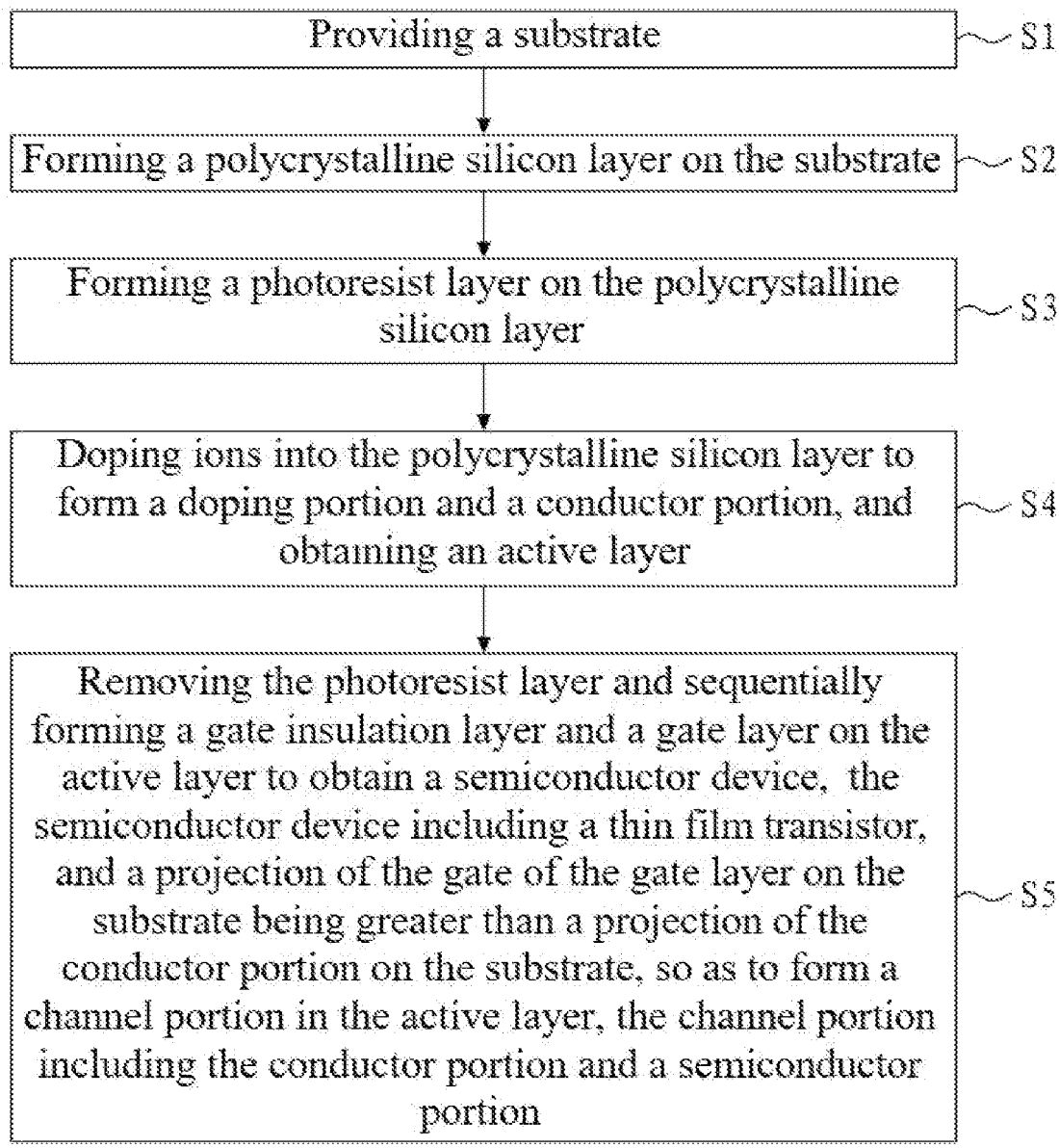
FIG. 5 is a flowchart of a manufacturing method of the semiconductor device provided by an embodiment of the present disclosure.

In addition, as shown in FIG. 5, the embodiment of the present disclosure provides a manufacturing method of a semiconductor device, which may include step S1, step S2, step S3, step S4 and step S5.

At step S1, providing a substrate. A structure of the semiconductor device corresponding to the step S1 is shown in (a) of FIG. 6;

At step S2, forming a polycrystalline silicon layer on the substrate. A structure of the semiconductor device corresponding to the step S2 is shown in (a) of FIG. 6.

Figure 6:
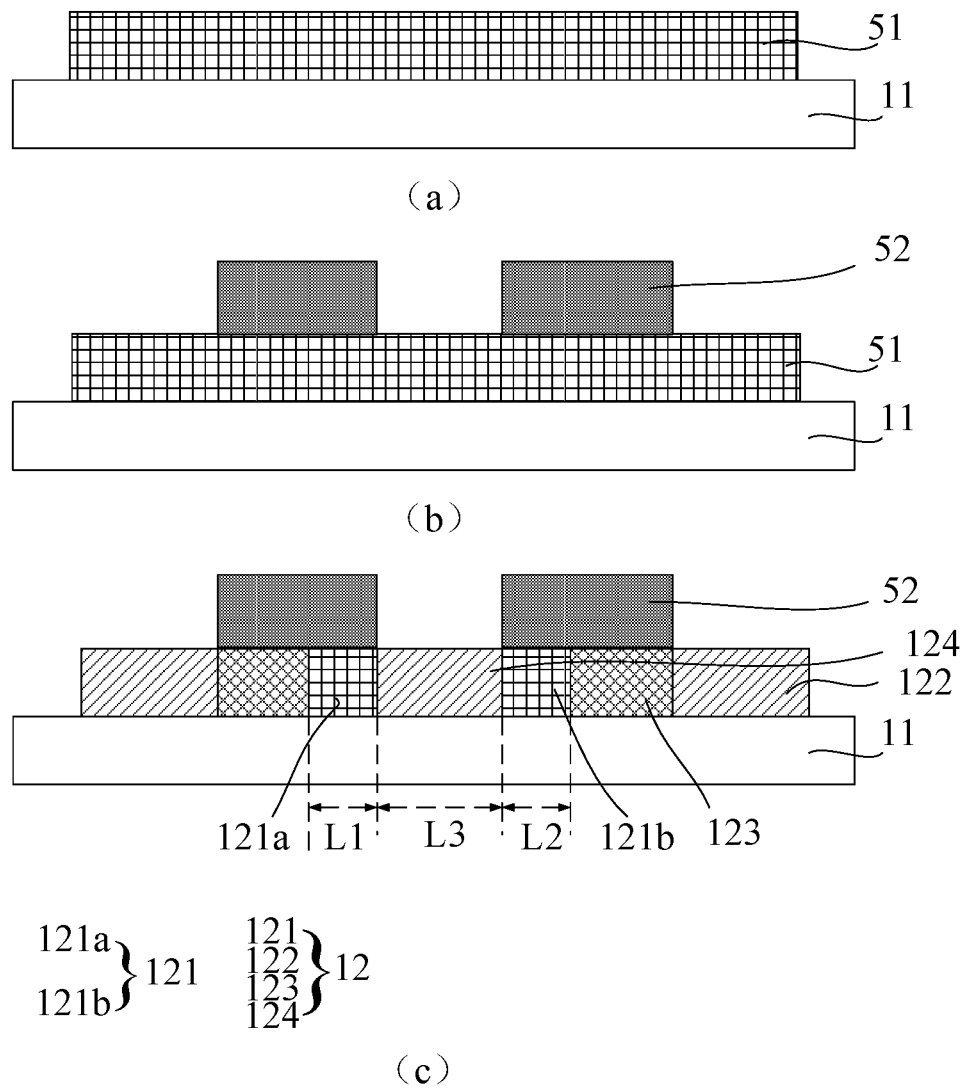
FIG. 6 is a schematic view corresponding to various steps of the manufacturing method of the semiconductor device provided by an embodiment of the present disclosure.

Specifically, as shown in (a) of FIG. 6, when forming the polycrystalline silicon layer 51, the entire surface of polycrystalline silicon may be formed, and then the polycrystalline silicon may be patterned to form the polycrystalline silicon layer 51.

At step S3, forming a photoresist layer on the polycrystalline silicon layer. A structure of the semiconductor device corresponding to the step S3 is shown in (b) in FIG. 6;

Specifically, as shown in (b) in FIG. 6, when forming a photoresist layer 52, a photoresist layer 52 can be formed on the entire surface, and then formed through exposure and development.

S4, doping ions into the polycrystalline silicon layer to form a doping portion and a conductor portion, and obtaining an active layer; The structure of the semiconductor device corresponding to this step is shown in (c) in FIG. 6;

Specifically, when doping ions into the polycrystalline silicon layer, due to the obstruction of the photoresist layer, the doped ions may be doped to the doping and conductor portions, rather than to the parts blocked by the photoresist layer, resulting in the presence of doped ions in some areas of the active layer and the absence of doped ions in some areas.

Specifically, when an electrical adjustment layer needs to be disposed, ions may be doped into the polycrystalline silicon layer to form the electrical adjustment layer before forming the photoresist layer.

At step S5, removing the photoresist layer and sequentially forming a gate insulation layer and a gate layer on the active layer to obtain a semiconductor device, in which the semiconductor device includes a thin film transistor, and a projection of the gate of the gate layer on the substrate is greater than a projection of the conductor portion on the substrate, so as to form a channel portion in the active layer. A structure of the semiconductor device corresponding to the step S5 is shown in FIG. 1.

The embodiment of the present disclosure provides the manufacturing method of the semiconductor device, in the involves manufacturing method of the semiconductor device, doping ions into a polycrystalline silicon layer to form a conductor portion, making a part of the active layer under the gate ineffective, and making the channel portion realize the normal function of the channel. Both the conductor portion and the gate may be prepared with the maximum accuracy of the exposure machine. The channel length is defined as a difference in width between the gate and the conductor portion, allowing the channel length to break through the accuracy limit of the exposure machine, reducing the channel length, and increasing the mobility of the thin film transistor.

It can be understood that throughout the entire process, the conductor portion may be disposed with the maximum accuracy of the exposure machine. For example, if the maximum accuracy of the exposure machine is capable of preparing electrodes or wires with a width of 1.5 microns, the conductor portion may be 1.5 microns, and the gate may be 2 microns, resulting in a channel length of 0.5 microns, which breaks the accuracy limit of the exposure machine, reduces the channel length, and improves the mobility of the thin film transistor.

The embodiment of the present disclosure provides an electronic device, which includes the thin film transistor as described in any of the foregoing embodiments.

According to the above embodiments, it can be obtained that:

the embodiments of the present disclosure provide the semiconductor device and the electronic device. The semiconductor device includes the thin film transistor, the thin film transistor includes the substrate, and the active layer and the gate layer. The active layer is disposed on a side of the substrate, and the active layer includes the doped portion and the channel portion. The gate layer is disposed on a side of the active layer away from the substrate, and the gate layer includes the gate. The active layer includes the conductor portion, the projection of the conductor portion on the substrate is located within the projection of the gate on the substrate, and the channel portion is disposed between the conductor portion and the doped portion. By the active layer including the conductor portion, and the projection of the conductor portion on the substrate being located within the projection of the gate on the substrate, the conductor portion is not controlled by the gate, and the channel portion between the conductor portion and the doping portion is controlled by the gate to ensure that the thin film transistor may work normally. At the same time, the width of the channel portion may be controlled by controlling the width of the gate and the width of the conductor portion, and both the gate and conductor portions may be prepared with the maximum accuracy of the exposure machine, which may ensure that the channel length may break through the accuracy limit of the exposure machine, thereby improving the mobility of the thin film transistor.

In the foregoing embodiments, the description of each of the embodiments has respective focuses. For a part that is not described in detail in an embodiment, reference may be made to relevant descriptions in other embodiments. Details are not further described herein.

The semiconductor device and the electronic device provided in the embodiments of the present disclosure are described in detail above. The principle and implementations of the present disclosure are described in this specification by using specific examples. The description about the foregoing embodiments is merely provided to help understand the technical solutions and core ideas of the present disclosure. Persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A semiconductor device comprising a thin film transistor, the thin film transistor comprising:
    a substrate;
    an active layer disposed on a side of the substrate, the active layer comprising a doped portion and a channel portion; and
    a gate layer disposed on a side of the active layer away from the substrate, the gate layer comprising a gate;
    wherein the active layer comprises a conductor portion, a projection of the conductor portion on the substrate is located within a projection of the gate on the substrate, and the channel portion is disposed between the conductor portion and the doped portion;
    wherein the active layer further comprises an electrical property adjustment portion, the electrical property adjustment portion is located between the doped portion and the channel portion, and a doping ion concentration in the electrical property adjustment portion is greater than or equal to a doping ion concentration in the channel portion and is less than the doping ion concentration in the doped portion.

2. The semiconductor device of claim 1, wherein the doped portion comprises a plurality of parts, the thin film transistor further comprises a source drain layer, the source drain layer comprises a source and a drain, the source and the drain are respectively connected with the plurality of parts of the doped portion, and a doping ion concentration in the conductor portion is greater than or equal to a doping ion concentration in the doped portion.

3. The semiconductor device of claim 1, wherein a width of the channel portion is smaller than a width of the conductor portion.

4. The semiconductor device of claim 1, wherein a width of the channel portion is less than 1.5 microns.

5. The semiconductor device of claim 1, wherein the channel portion comprises a first channel portion and a second channel portion, and the first channel portion and the second channel portion are disposed at two sides of the conductor portion.

6. The semiconductor device of claim 2, wherein a width of the first channel portion is greater than or equal to a width of the second channel portion.

7. An electronic device comprising a semiconductor device, the semiconductor device comprising the thin film transistor of claim 1.

8. The electronic device of claim 7, wherein the doped portion comprises a plurality of parts, the thin film transistor further comprises a source drain layer, the source drain layer comprises a source and a drain, the source and the drain are respectively connected with the plurality of parts of the doped portion, and a doping ion concentration in the conductor portion is greater than or equal to a doping ion concentration in the doped portion.

9. The electronic device of claim 7, wherein a width of the channel portion is smaller than a width of the conductor portion.

10. The electronic device of claim 7, wherein a width of the channel portion is less than 1.5 microns.

11. The electronic device of claim 7, wherein the channel portion comprises a first channel portion and a second channel portion, and the first channel portion and the second channel portion are disposed at two sides of the conductor portion.

12. The electronic device of claim 11, wherein a width of the first channel portion is greater than or equal to a width of the second channel portion.

13. A semiconductor device comprising a thin film transistor, the thin film transistor comprising:
   a substrate;
   an active layer disposed on a side of the substrate, the active layer comprising a doped portion and a channel portion; and
   a gate layer disposed on a side of the active layer away from the substrate, the gate layer comprising a gate;
   wherein the active layer comprises a conductor portion, a projection of the conductor portion on the substrate is located within a projection of the gate on the substrate, and the channel portion is disposed between the conductor portion and the doped portion;
   wherein the thin film transistor further comprises a shielding metal, the shielding metal is disposed between the active layer and the gate layer, a projection of the shielding metal on the substrate is located within the projection of the gate on the substrate, and a width of the shielding metal is smaller than a width of the gate.

14. The semiconductor device of claim 13, wherein the thin film transistor further comprises a gate insulating layer disposed between the active layer and the gate layer, the shielding metal is covered by the gate insulating layer, and the shielding metal is in contact with the conductor portion.

15. The semiconductor device of claim 13, wherein the thin film transistor further comprises a first insulating layer and a second insulating layer, the first insulating layer is disposed between the active layer and the shielding metal, and the second insulating layer is disposed between the shielding metal and the gate layer.

16. An electronic device comprising a semiconductor device, the semiconductor device comprising the thin film transistor of claim 6.

17. The electronic device of claim 16, wherein the thin film transistor further comprises a gate insulating layer disposed between the active layer and the gate layer, the shielding metal is covered by the gate insulating layer, and the shielding metal is contacted with the conductor portion.

18. The electronic device of claim 16, wherein the thin film transistor further comprises a first insulating layer and a second insulating layer, the first insulating layer is disposed between the active layer and the shielding metal, and the second insulating layer is disposed between the shielding metal and the gate layer.

* * * * *